United States Patent [19]

Matsukawa et al.

[11] Patent Number: 4,642,881
[45] Date of Patent: Feb. 17, 1987

[54] METHOD OF MANUFACTURING NONVOLATILE SEMICONDUCTOR MEMORY DEVICE BY FORMING ADDITIONAL IMPURITY DOPED REGION UNDER THE FLOATING GATE

[75] Inventors: Naohiro Matsukawa, Kamakura; Sigeru Morita, Tokyo; Hiroshi Nozawa, Yokohama, all of Japan

[73] Assignee: Kabushiki Kaisha Toshiba, Kawasaki, Japan

[21] Appl. No.: 735,211

[22] Filed: May 17, 1985

[30] Foreign Application Priority Data

May 17, 1984 [JP] Japan .................................. 59-99262
Aug. 28, 1984 [JP] Japan ................................. 59-177436

[51] Int. Cl.$^4$ ..................... G11C 11/40; H01L 21/283
[52] U.S. Cl. ................................ 29/576 B; 29/571; 148/1.5; 148/187; 148/DIG. 82; 357/23.12; 357/23.14; 357/91
[58] Field of Search .................. 148/1.5, 187; 29/571, 29/576 B; 357/23.12, 23.14, 91

[56] References Cited

U.S. PATENT DOCUMENTS

| | | | |
|---|---|---|---|
| 4,149,905 | 4/1979 | Levinstein et al. | 148/1.5 |
| 4,203,158 | 5/1980 | Bentchkowsky et al. | 365/185 |
| 4,295,265 | 10/1981 | Horiuchi et al. | 29/571 |
| 4,409,723 | 10/1983 | Harari | 29/571 |
| 4,514,897 | 5/1985 | Chiu et al. | 29/578 |
| 4,517,732 | 5/1985 | Oshikawa | 29/571 |
| 4,519,849 | 5/1985 | Korsh et al. | 148/1.5 |

OTHER PUBLICATIONS

Topich et al, Appl. Phys. Letts., 41 (1982) 641.

Primary Examiner—Upendra Roy
Attorney, Agent, or Firm—Finnegan, Henderson, Farabow, Garrett & Dunner

[57] ABSTRACT

A method of manufacturing a nonvolatile semiconductor memory device having a gate oxide layer including a relatively thin silicon dioxide layer. This gate oxide layer including the thin silicon dioxide layer is formed by the steps of forming the gate oxide film on a semiconductor element region in a silicon substrate; removing a portion of the gate oxide film to expose a portion of the silicon substrate; implanting impurity ions in the exposed portion of the substrate to an extent that a peak concentration of the impurity ions exceeds a solid solution limit at a temperature of the following thermal annealing step; activating the implanted impurity by thermal annealing so as to form a high impurity concentration layer and thermally oxidizing a surface of the high impurity concentration layer to form the thin silicon dioxide layer.

19 Claims, 13 Drawing Figures

F I G. 1
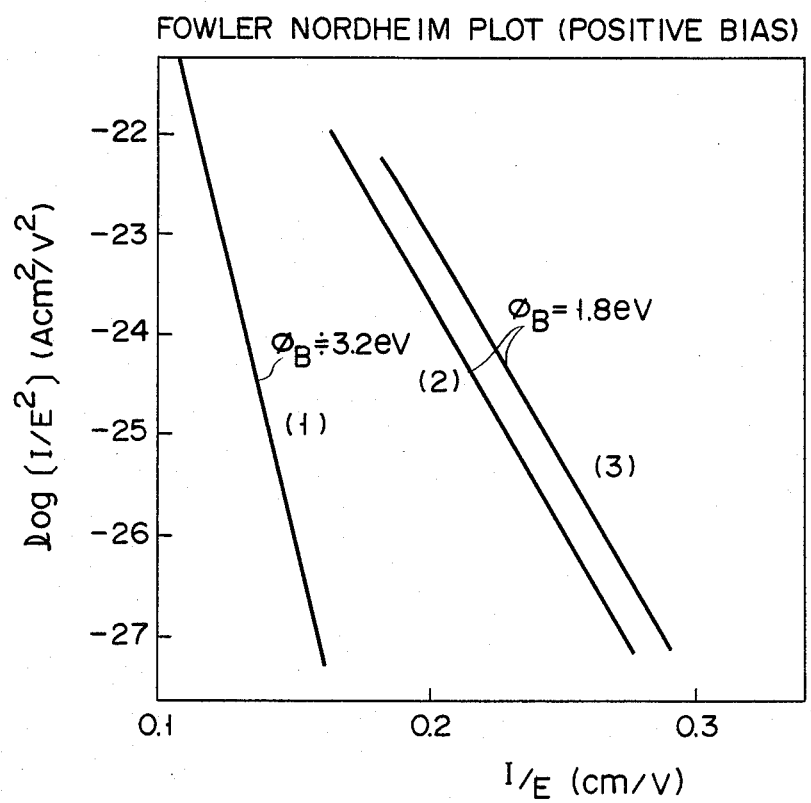

METHOD OF MANUFACTURING NONVOLATILE SEMICONDUCTOR MEMORY DEVICE BY FORMING ADDITIONAL IMPURITY DOPED REGION UNDER THE FLOATING GATE

BACKGROUND OF THE INVENTION (a) Field of the Invention

The present invention relates to a method of manufacturing a nonvolatile semiconductor memory device which can improve write/erase characteristics by decreasing a barrier height.

(b) Description of the Prior Art

In a floating gate type nonvolatile memory, an electrically isolated floating gate electrode is provided under a control gate electrode, and charges in the floating gate electrode are controlled by the control gate electrode so as to store them as data. In a nonvolatile memory of this type, an erase voltage (injection of electrons into the floating gate electrode) and a write voltage (extraction of electrons from the floating gate electrode) for erasing/writing are effected through a tunnel current flowing in a gate oxide film, which is dependent upon an electric field between the floating gate electrode and the drain region. Thus, data write/erase is easier with a thin gate oxide film.

When an electric field is constant, the tunnel current is determined by the barrier height of a thin silicon oxide film. In the case of a conventional thin silicon dioxide film, the barrier height is about 3.2 eV. Assuming that the thickness of the silicon dioxide film is set to be 200 Å and a write/erase pulse width is set at 1 msec., a relatively high write voltage of about 24 V (a voltage applied to the drain for shifting Vth to extract electrons from the floating gate electrode) of an EEPROM cell is required, and an erase voltage of about 24 V (a voltage applied to the control gate electrode for shifting Vth to inject electrons into the floating gate electrode) is also required.

In this manner, when the EEPROM cell requires a high voltage, not only the EEPROM cell itself but also peripheral elements must be able to withstand a high voltage. Thus, the manufacturing process and circuit configuration are complex, resulting in poor density, reliability, and performance. Therefore, the write and erase voltages must be decreased.

SUMMARY OF THE INVENTION

The present invention has been made in consideration of the above situation, and has as its object to provide a method of manufacturing a nonvolatile semiconductor memory device which can decrease write/erase voltages in an EEPROM.

In order to achieve the above object, there is provided a method of manufacturing a nonvolatile semiconductor memory device, comprising the steps of:

(i) forming an element isolation insulating film on a surface of a silicon substrate of a first conductivity type and forming an island element region isolated by the insulating film;

(ii) forming a gate oxide film including a relatively thin silicon dioxide film portion in the element region by thermal oxidation; and (iii) forming a floating gate electrode at least on the silicon dioxide film portion, wherein the step (ii) of forming the gate oxide film comprises the steps of:

(a) forming the gate oxide film on the element region;

(b) removing a portion of the gate oxide film to expose a portion of the silicon substrate, and implanting impurity ions in the exposed portion to an extent that a peak concentration thereof exceeds a solid solution limit at a temperature in the following thermal annealing step;

(c) activating the implanted impurity by thermal annealing so as to form a high concentration impurity layer; and (d) thermally oxidizing a surface of the high concentration impurity layer so as to form a thin silicon oxide film.

As a main feature of the present invention, in order to achieve an easy write/erase operation, when a thermal silicon dioxide film is formed in a portion of the gate oxide film, 1 an impurity is ion-implanted in the silicon substrate to an extent exceeding a solid solution limit (in the thermal annealing step) (for example, when As is used as an impurity, it is ion-implanted to a concentration of $1 \times 10^{19}$ to $5 \times 10^{20}$ cm$^{-3}$ after annealing), and 2 after ion-implantation, the resultant structure is annealed so as to cause the impurities to cluster. As a result, it is assumed that the clusters are introduced in the oxide film in the thermal oxidation step to be performed later, thus considerably decreasing a barrier height to about 1.8 eV. The barrier height of a conventional film is about 3.2 eV. For example, the Fowler Nordheim Plot of current-voltage characteristics in the conventional oxide film (the ordinate: log [I/E$^2$], the abscissa: I/E; where I indicates a current and E indicates an electric field) is indicated by a line (1) in FIG. 1. A barrier height $\phi_B$ of the conventional film is calculated from the slope of the line (1) to be 3.2 eV. In contrast to this, according to the present invention, when As is ion-implanted, e.g., at an acceleration voltage of 40 keV and a dose of $5 \times 10^{15}$/cm$^{-2}$, and an impurity concentration of As is increased to an extent exceeding the solid solution limit in the annealing step to be performed later, oxide films of thicknesses of 190 A and 225 A formed on the substrate after annealing have the characteristics indicated by lines (2) and (3) in FIG. 1, respectively. Thus, the barrier height $\phi_B$ of these oxide films is calculated from the slope of the lines (2) and (3) to be 1.8 eV. When a silicon dioxide film having a low barrier height is used, electrons can be injected/extracted in/from a floating gate electrode with low write/erase voltages as compared to a conventional device. Therefore, a complex structure for withstanding a high voltage is not needed, and cells can be integrated at high density. This results in high reliability and high performance, and since the device can be operated at a low voltage, an EEPROM does not break down easily, and quick data write/erase can be performed.

BRIEF DESCRIPTION OF THE DRAWINGS

FIG. 1 is a graph showing a comparison between a barrier height of a memory device according to the present invention and that of a conventional device;

DETAILED DESCRIPTION OF THE PREFERRED EMBODIMENTS

Example 1

FIGS. 2A to 2H show manufacturing steps of an embodiment of the method of the present invention.

Figure 2A:
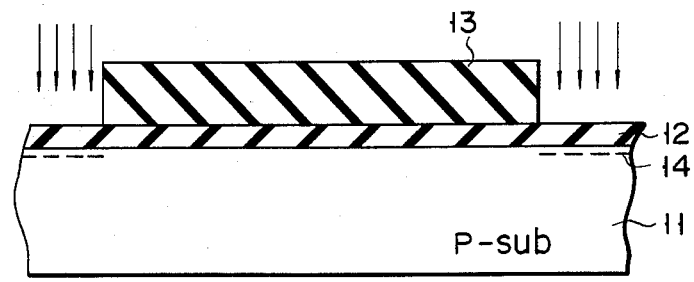
FIGS. 2A to 2H are sectional views sequentially showing steps of manufacturing a device according to an embodiment of the method of the present invention.

A buffer oxide film 12 of a thickness of 1,000 Å is formed on a p-type silicon substrate 11, and a silicon nitride film ($Si_3N_4$) is deposited on the film 12 to a thickness of 3,000 Å. A resist pattern is formed on the $Si_3N_4$ film. The resist pattern has an opening corresponding to a field oxide film forming region for isolating an element region in an island shape. The silicon nitride film is selectively etched using the resist pattern as a mask to obtain an $Si_3N_4$ film pattern 13 having an opening corresponding to the field oxide film forming region. After removing the resist pattern, in order to form a channel stopper, B is ion-implanted at an acceleration voltage of 40 keV and a dose of $5 \times 10^{13}$ cm$^{-2}$ using the pattern 13 as a mask, thus forming an ion-implantation layer 14 (FIG. 2A).

Figure 2B:
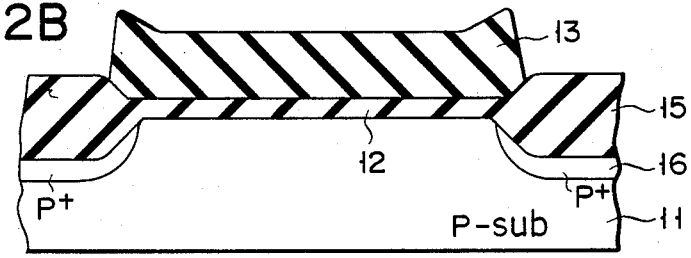
Figure 2C:
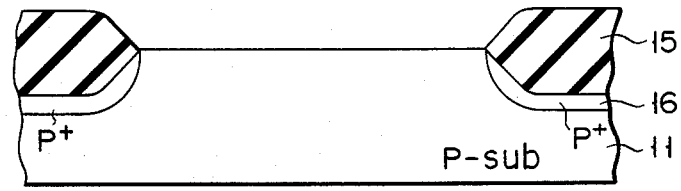
Figure 2D:
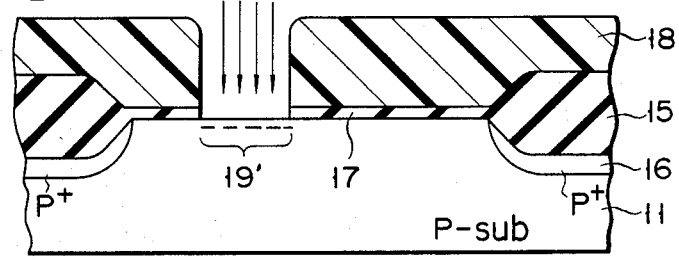
Figure 2E:
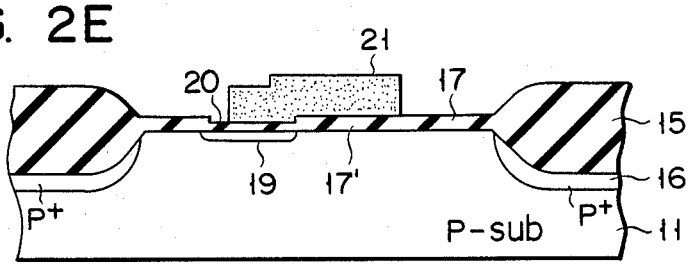
Figure 3:
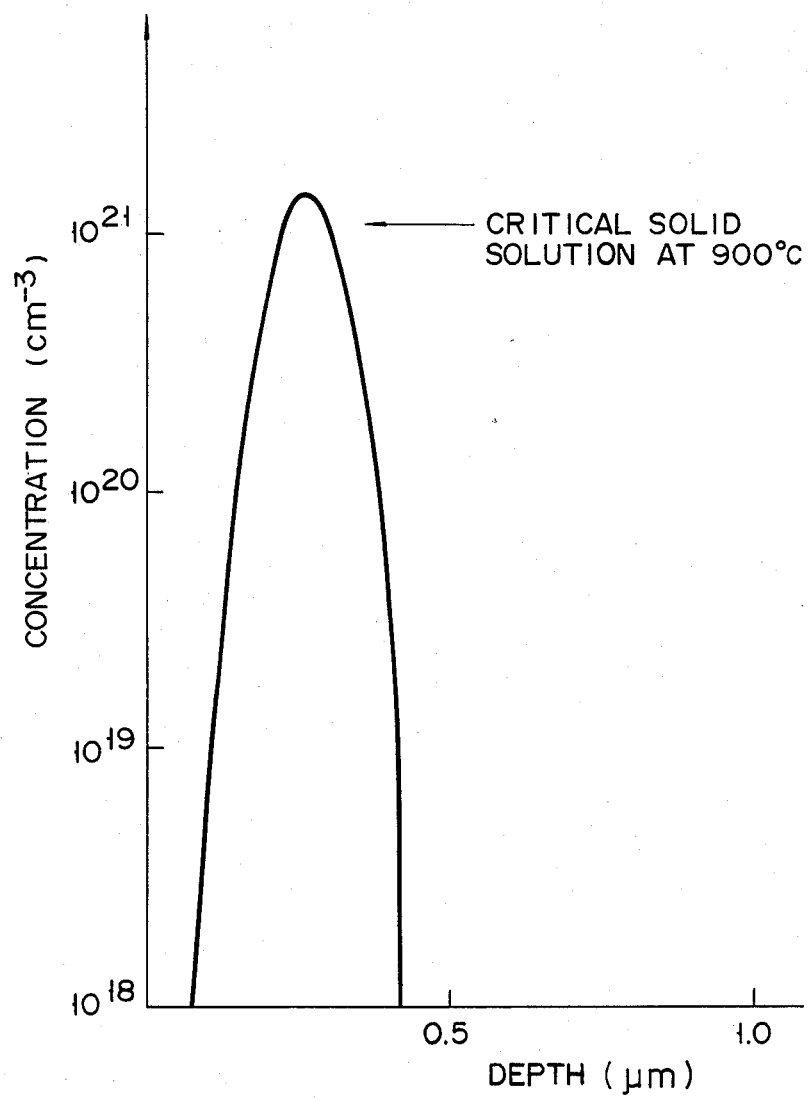
FIG. 3 is a graph showing a profile of an As concentration along a direction of depth immediately after As for forming a high concentration impurity layer is ion-implanted.

The resultant structure is then subjected to wet oxidation using $H_2O$ at a temperature of 1,000° C. so as to grow a field oxide film 15 on the exposed surface of the substrate 11. In this case, B atoms in the layer 14 are activated and form a channel stopping layer 16 under the film 15 (FIG. 2B). The resultant structure is subjected to dry etching so as to remove the pattern 13, and the film 12 is also removed using an ammonium fluoride solution (FIG. 2C). Then, the resultant structure is subjected to $O_2$ thermal oxidation, thus growing a gate oxide film with a thickness of 500 Å on the exposed surface of the substrate 11. Although not performed in this Example, ion-implantation for controlling a threshold value may be performed. Thereafter, a resist is coated on the overall surface of the resultant structure and is photoetched to form a resist pattern 18 having an opening corresponding to a thin $SiO_2$ film forming region. The gate oxide film exposed in the opening of the pattern 18 is etched by an ammonium fluoride solution using the pattern 18 as a mask so as to form a gate oxide film pattern 17. Then, As is ion-implanted in a portion of a drain region and a portion 19' of a channel region adjacent thereto at an acceleration voltage of 40 keV and a dose of $5 \times 10^{15}$ cm$^{-2}$ using the pattern 17 and film 15 as a mask (FIG. 2D). In this case, an As concentration profile in the substrate is as shown in FIG. 3, and its peak concentration exceeds the solid solution limit. Thereafter, the resist pattern 18 is removed, and the resultant structure is subjected to heat annealing in an Ar atmosphere including 7% of oxygen at a temperature of 900° C. for 30 minutes, thereby forming a high concentration impurity layer 19 (surface impurity concentration: about $5.2 \times 10^{19}$ cm$^{-3}$) in a portion of the drain region and a portion of the channel region adjacent thereto. After about 200 Å of the oxide film on the layer 19 are removed, the resultant structure is subjected to thermal oxidation in an $O_2$ atmosphere diluted with Ar at a temperature of 900° C., thus forming a thin $SiO_2$ film 20 with a thickness of 200 Å on the exposed surface of the substrate 11. The film 20 serves to inject-/extract electrons in/from a floating gate electrode. Then, a polycrystalline silicon film of 4,000 Å is formed on the overall surface of the structure. The resultant structure is then subjected to annealing in $POCl_3$ atmosphere at a temperature of 1,000° C. for 30 minutes so as to diffuse P in the polycrystalline silicon film. Thereafter, the polycrystalline silicon film is etched using a resist pattern, thus forming a floating gate electrode 21. In this case, a gate electrode and a wiring layer for a peripheral MOS transistor are simultaneously patterned (FIG. 2E).

Figure 2F:
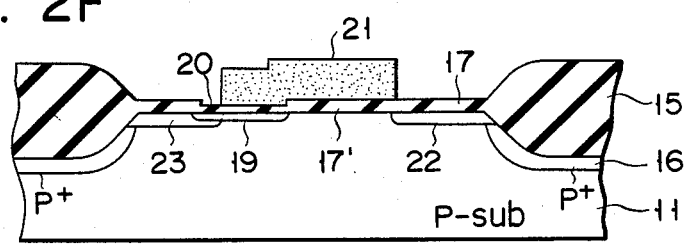
Figure 2G:
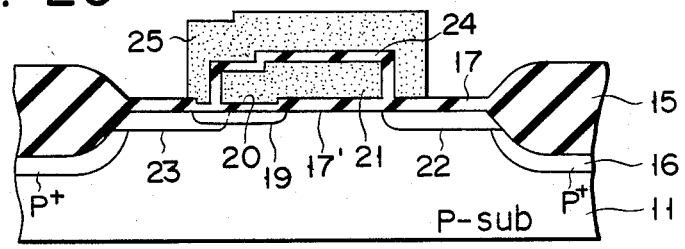

As is ion-implanted at an acceleration voltage of 40 keV and a dose of $5 \times 10^{15}$ cm$^{-2}$ using the electrode 21 and the film 15 to form source and drain regions 22 and 23 (FIG. 2F). The resultant structure is subjected to thermal oxidation in an $O_2$ atmosphere at a temperature of 900° C. for 30 minutes, thus forming a gate oxide film 24 of 800 Å thickness, for a contral gate electrode so as to cover the electrode 21. Thereafter, a polycrytalline silicon film of 4,000 Å thickness is formed on the overall surface of the structure. The structure is subjected to thermal treatment in a $POCl_3$ atmosphere at a temperature of 900° C. for 30 minutes so as to diffuse P in the polycrystalline silicon film. Then, a resist pattern having an opening other than a control gate electrode forming region is formed on the overall surface of the structure, and the polycrystalline silicon film is etched using the resist pattern as a mask so as to form a control gate electrode 25 (FIG. 2G).

Figure 2H:
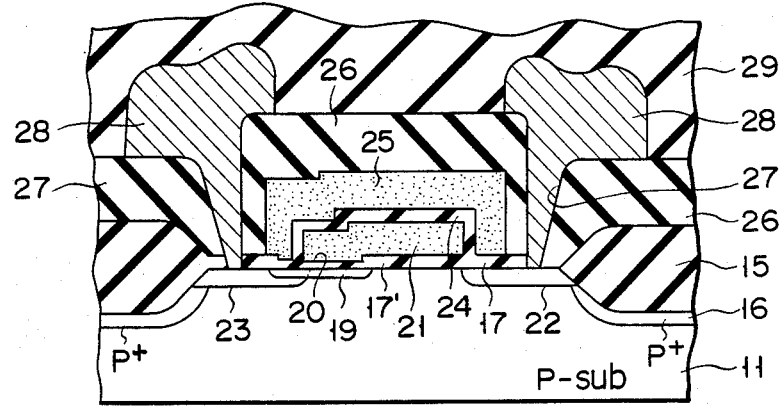

Thereafter, an insulating interlayer 26 and contact holes 27 are formed therein in accordance with a known method. Then, a metal wiring layer is deposited on the surface of the structure and is patterned, thus forming wiring layers 28 connected to the source and drain regions 22 and 23 through the contact holes 27. Thereafter, a passivation film 29 is formed on the structure, thus obtaining an EEPROM (FIG. 2H).

Note that other inert gas such as $N_2$ can be used instead of Ar used in this Example. In this Example, the layer 19 of the channel region is formed by ion-implanting As. However, it can be formed by ion-implanting P. Alternatively, it can be formed by ion-implanting As and P or As and B. When the layer 19 is formed, if a thin oxide film is formed without annealing, a barrier height can only be decreased to 3.0 eV (when a conventional oxide film is formed on a low concentration substrate, a barrier height thereof is 3.2 eV). However, as in this Example, when the oxide film is formed after annealing, a barrier height thereof can be decreased to 2.7 eV. When the oxide film is formed on the high concentration impurity layer 19, it is grown faster than the case of a low concentration impurity layer. Therefore, in order to form a thin oxide film on the high concentration impurity layer, an oxidation agent may be diluted with an inert gas such as Ar so as to decrease an oxidation rate. Furthermore, when the thin oxide film is formed, water vapor can be used as the oxidation agent instead of oxygen. In this case, the barrier height can be greatly decreased (to 1.8 eV).

Example 2

Figure 4:
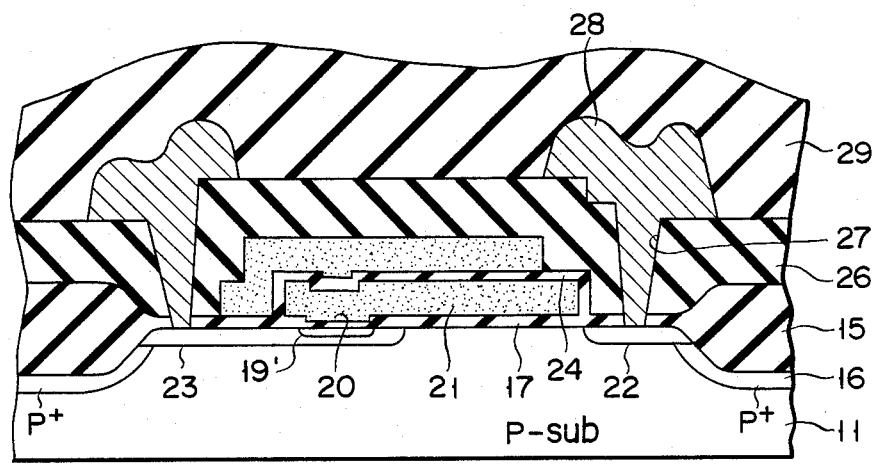
FIG. 4 is a sectional view of a semiconductor memory device manufactured according to another embodiment of the method of the present invention.

In Example 1, the thin $SiO_2$ film 20 is formed on the overall surface of the impurity layer 19 formed in a portion of the drain region and a portion of the channel region adjacent thereto. However, in this Example, an impurity layer is formed only in a portion of a drain region 23 as indicated by reference numeral 19′, as shown in FIG. 4, and the SiO$_2$ thin film 20 is formed on the layer 19′ in the same manner as in Example 1. With this structure, the same effect as in Example 1 can be obtained.

Note that in Example 1 when the EEPROM with wide layer 19 is completed, a total surface concentration of P and B (n- and p-type impurities) in the layer 19 may be controlled to be about $1 \times 10^{19}$ cm$^{-3}$ to $5 \times 10^{20}$ cm$^{-3}$ and a difference between impurity carrier concentrations of P and B in the layer 19 is controlled to be $\pm 1 \times 10^{14}$ cm$^{-3}$ by combination of thermal treatment steps in the manufacturing process after ion-implanting impurities in the layer 19. Therefore, a threshold voltage Vth of the EEPROM cell can be set to be $\pm 2$ V when it is completed. Although it is difficult to control Vth, satisfactory reproducibility in the manufacturing process can be obtained. Since the EEPROM cell does not require as precise an initial threshold voltage Vth as other MOS memory cells (DRAM, CRAM and the like), it can be ignored. Thus, the EEPROM cell can be micropatterned.

Figure 5:
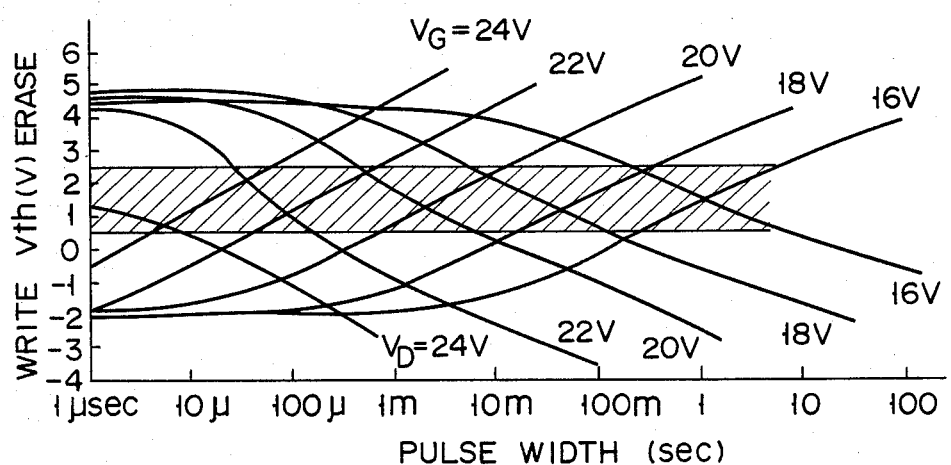
FIG. 5 is a graph showing write/erase pulse characteristics in a conventional device.
Figure 6:
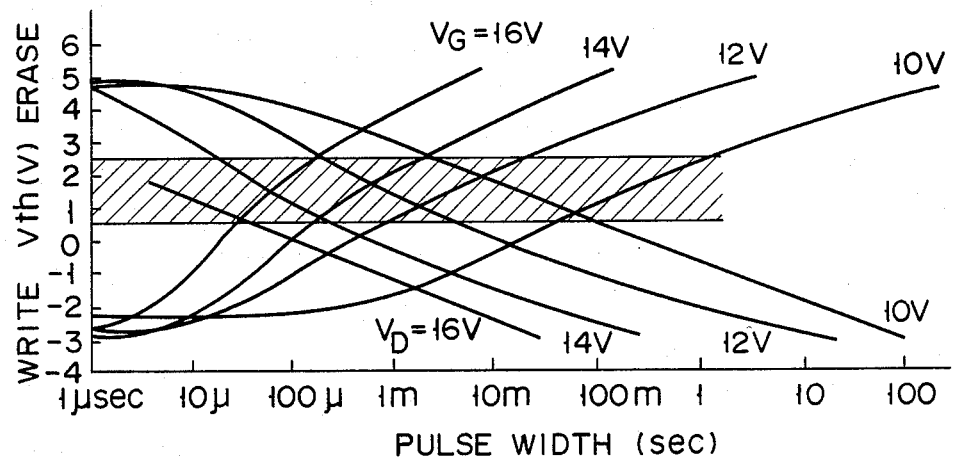
FIG. 6 is a graph showing write/erase pulse characteristics in the device manufactured according to the present invention.

When a thickness of the SiO$_2$ film for the floating gate electrode is set to be 200 Å, a write/erase voltage of Example 1 is as shown in FIGS. 5 and 6 in comparison with a conventional structure (with a thin oxide film with a barrier height of 3.2 eV used for write/erase operations). Note that FIG. 5 shows write/erase characteristics of a conventional device, and FIG. 6 shows those of the device according to the present invention.

As can be seen from these graphs, when an application voltage has a pulse width of 1 msec, the write/erase voltages of the conventional structure are about 24 V/24 V. However, in the structure of Example 1, they are about 16 V/16 V. Also, the structures in Example 2 can be opertated at about 16 V/16 V. Thus, since the operation voltages are decreased, a complex structure able to withstand a high voltage is not needed. Therefore, the cell can be highly integrated and this results in high reliability and high performance. Since the device can be operated at a low voltage, an EEPROM cannot easily be destroyed, and quick data write/erase can be performed.

What is claimed is:

1. A method of manufacturing a nonvolatile semiconductor memory device comprising the steps of:
    (i) forming an element isolation insulating film on a surface of a silicon substrate of a first conductivity type and forming an island element region isolated by said insulating film;
    (ii) thereafter forming a gate oxide film including a relatively thin silicon dioxide film portion in said element region by thermal oxidation; and
    (iii) thereafter forming a floating gate electrode at least on said silicon dioxide film portion, wherein the step (ii) of forming said gate oxide film comprises the steps of:
        (a) forming said gate oxide film on said element region;
        (b) thereafter removing a portion of said gate oxide film to expose a portion of said silicon substrate, and implanting impurity ions in the exposed portion to an extent that a peak concentration thereof exceeds a solid solution limit at a temperature in the following thermal annealing step;
        (c) thereafter activating the implanted impurity by thermal annealing so as to form a high concentration impurity layer; and
        (d) thereafter thermally oxidizing a surface of said high concentration impurity layer so as to form a silicon dioxide thin film.

2. A method according to claim 1, wherein the ion-implantation in the step (b) is performed by ion-implanting an impurity or an impurity combination selected from the group consisting of arsenic, phosphorus, arsenic/phosphorus, and arsenic/boron.

3. A method according to claim 1, wherein the thermal annealing in the step (c) is performed in an oxygen atmosphere diluted with an inert gas.

4. A method according to claim 1, wherein in the step (d), said silicon dioxide thin film is formed in an oxygen atmosphere diluted with an inert gas.

5. A method according to claim 1, wherein in the step (d), said silicon dioxide thin film is formed in a water vapor atmosphere diluted with an inert gas.

6. A method according to claim 1, wherein ion-implantation is performed in a channel region after forming the gate oxide film in the step (a).

7. A method according to claim 1, wherein the thermal annealing in the step (c) is performed at a temperature not lower than 400° C.

8. A method according to claim 1, wherein the ion-implantation in the step (b) is performed to obtain an impurity concentration of $1 \times 10^{19}$ cm$^{-3}$ to $5 \times 10^{20}$ cm$^{-3}$ in the high concentration impurity layer after the thermal annealing in the step (c).

9. A method according to claim 1, wherein the ion-implantation in the step (b) is performed using a combination of p-type and n-type impurities, and a difference in impurity carrier concentration thereof is set to be within $\pm 1 \times 10^{14}$ cm$^{-3}$.

10. A method according to claim 1, wherein the ion-implantation in the step (b) is performed in a channel region.

11. A method according to claim 1, wherein the ion-implantation in the step (b) is performed in a portion of a drain region and a portion of a channel region adjacent thereto.

12. A method according to claim 1, wherein the ion-implantation in the step (b) is performed in a drain region.

13. A method according to claim 1, wherein the ion-implantation in the step (b) is performed so that the implanted impurity is partially precipitated as clusters at a temperature in the thermal annealing step.

14. A method according to claim 3 wherein said inert gas is argon or nitrogen.

15. A method according to claim 4 wherein said inert gas is argon or nitrogen.

16. A method according to claim 5 wherein said inert gas is argon or nitrogen.

17. A method according to claim 7, wherein the thermal annealing in the step (c) is performed at a temperature of 900° C.

18. A method according to claim 8, wherein ions to be implanted are arsenic ions.

19. A method of manufacturing a nonvolatile semiconductor memory device comprising the steps of:
    (i) forming an element isolation insulating film on a surface of a silicon substrate of a first conductivity type and forming an island element region isolated by said insulating film;

(ii) thereafter forming a gate oxide film including a relatively thin silicon dioxide film portion in said element region by thermal oxidation; and (iii) thereafter forming a floating gate electrode at least on said silicon dioxide film portion, wherein the step (ii) of forming said gate oxide film comprises the steps of:

(a) forming said gate oxide film on said element region;

(b) thereafter removing a portion of said gate oxide film to expose a portion of said silicon substrate, and implanting impurity ions in the exposed portion to an extent that a peak concentration thereof ultimately exceeds a solid solution limit; and (c) thereafter thermally oxidizing a surface of said high concentration impurity layer so as to form a silicon dioxide thin film.

* * * * *